US008471605B2

(12) United States Patent
Lee et al.

(10) Patent No.: US 8,471,605 B2
(45) Date of Patent: Jun. 25, 2013

(54) DRIVING CIRCUIT HAVING CURRENT BALANCING FUNCTIONALITY

(75) Inventors: Ching-Tsan Lee, Hsin-Chu (TW); Chung-Wei Lin, Hsin-Chu (TW)

(73) Assignee: Leadtrend Technology Corp., Hsin-Chu (TW)

( * ) Notice: Subject to any disclaimer, the term of this patent is extended or adjusted under 35 U.S.C. 154(b) by 0 days.

(21) Appl. No.: 13/470,358

(22) Filed: May 14, 2012

(65) Prior Publication Data

US 2012/0293215 A1 Nov. 22, 2012

(30) Foreign Application Priority Data

May 17, 2011 (TW) ............................ 100117208 A

(51) Int. Cl.
*H03K 3/00* (2006.01)

(52) U.S. Cl.
USPC ............................................ 327/108; 345/82

(58) Field of Classification Search
USPC ............................................ 327/108; 345/82
See application file for complete search history.

(56) References Cited

U.S. PATENT DOCUMENTS 5,467,036 A * 11/1995 Sawada ........................ 327/108
7,733,034 B2 * 6/2010 Kotikalapoodi et al. ..... 315/294
7,825,610 B2 * 11/2010 Zhao et al. .................... 315/299
8,035,314 B2 * 10/2011 Zhao ............................ 315/297
8,035,315 B2 * 10/2011 Zhao et al. .................... 315/299
8,106,604 B2 * 1/2012 Zhao et al. .................... 315/299

* cited by examiner

*Primary Examiner* — Kenneth B. Wells
(74) *Attorney, Agent, or Firm* — Winston Hsu; Scott Margo

(57) ABSTRACT

A driving circuit having current balancing functionality includes a control unit, a bias resistor, a current switch unit and plural current driving modules. The control unit is utilized for generating a control signal having at least one bit according to a control current. The bias resistor is put in use for providing a bias voltage according to a bias current. The current switch unit employs the control signal and plural bias setting currents to generate the bias current, for keeping the bias voltage within a preset voltage range. The current driving modules are used to provide plural driving currents according to the bias voltage and the control signal. Each current driving module includes a current-limit control unit which is utilized for controlling a corresponding driving current according to the control signal.

15 Claims, 3 Drawing Sheets

DRIVING CIRCUIT HAVING CURRENT BALANCING FUNCTIONALITY

BACKGROUND OF THE INVENTION

1. Field of the Invention

The present invention relates to driving circuits, and particularly to a driving circuit having current balancing functionality.

2. Description of the Prior Art

FIG. 1 is a diagram of a light-emitting diode (LED) driving circuit. As shown in FIG. 1, when LED driving circuit 100 operates, front-end current setting unit 110 generates setting current Ipset according to reference voltage, current mirror 120 outputs bias current Ib according to setting current Ipset, bias resistor Rb provides bias voltage Vb according to bias current Ib, and a plurality of current driving modules 130 provide a plurality of driving currents Idr_1-Idr_N according to bias voltage Vb to drive a plurality of LED units 190 to emit output light having preset brightness. Current driving modules 130 described above utilize operational amplifier OP in coordination with feedback voltage provided by current-limit resistor Rc to perform error amplification processing, thereby driving buffer Buf to output driving voltage for controlling operation of transistor Qc.

However, offset voltage of each operational amplifier OP is not the same, so the current driving modules 130 have a hard time providing relatively similar driving currents Idr_1-Idr_N to drive the plurality of LED units 190 to generate uniform output light. Additionally, the lower bias voltage Vb is, the higher output voltage error percentage of operational amplifier OP is, i.e. output voltage error percentage of each operational amplifier OP changes with bias voltage Vb. Thus, LED driving circuit 100 not only has a hard time driving the plurality of LED units 190 to generate uniform output brightness, but also has a hard time performing precise control of driving currents over large ranges.

SUMMARY OF THE INVENTION

According to an embodiment, a driving circuit having current balancing functionality comprises a control unit, a bias resistor, a current switch unit, and a plurality of current driving modules. The control unit is for generating a control signal having at least one bit according to a control current. The bias resistor is for providing a bias voltage according to a bias current. The current switch unit is for generating the bias current according to the control signal and a plurality of bias setting current to keep the bias voltage within a preset voltage range. The plurality of current driving modules is for providing a plurality of driving currents according to the bias voltage and the control signal. Each current driving module comprises a current-limit control unit. The current-limit control unit is for controlling a corresponding driving current according to the control signal.

These and other objectives of the present invention will no doubt become obvious to those of ordinary skill in the art after reading the following detailed description of the preferred embodiment that is illustrated in the various figures and drawings.

DETAILED DESCRIPTION

In the following, a driving circuit having current balancing functionality is described in various embodiments with reference to the figures. The embodiments provided are not intended to be limiting upon the scope of the invention.

Figure 1:
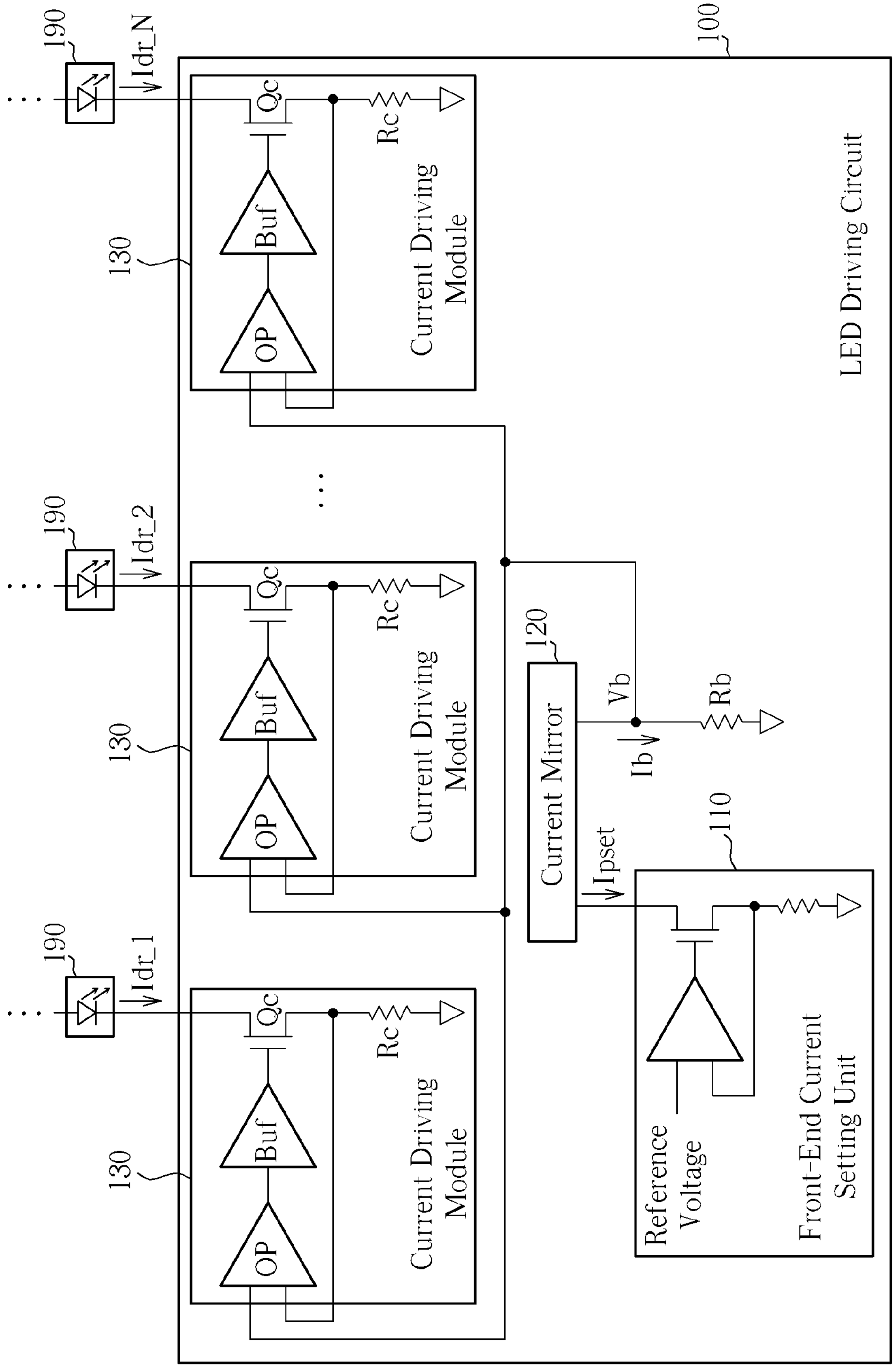
FIG. 1 PRIOR ART
FIG. 1 is a diagram of a light-emitting diode driving circuit.
Figure 2:
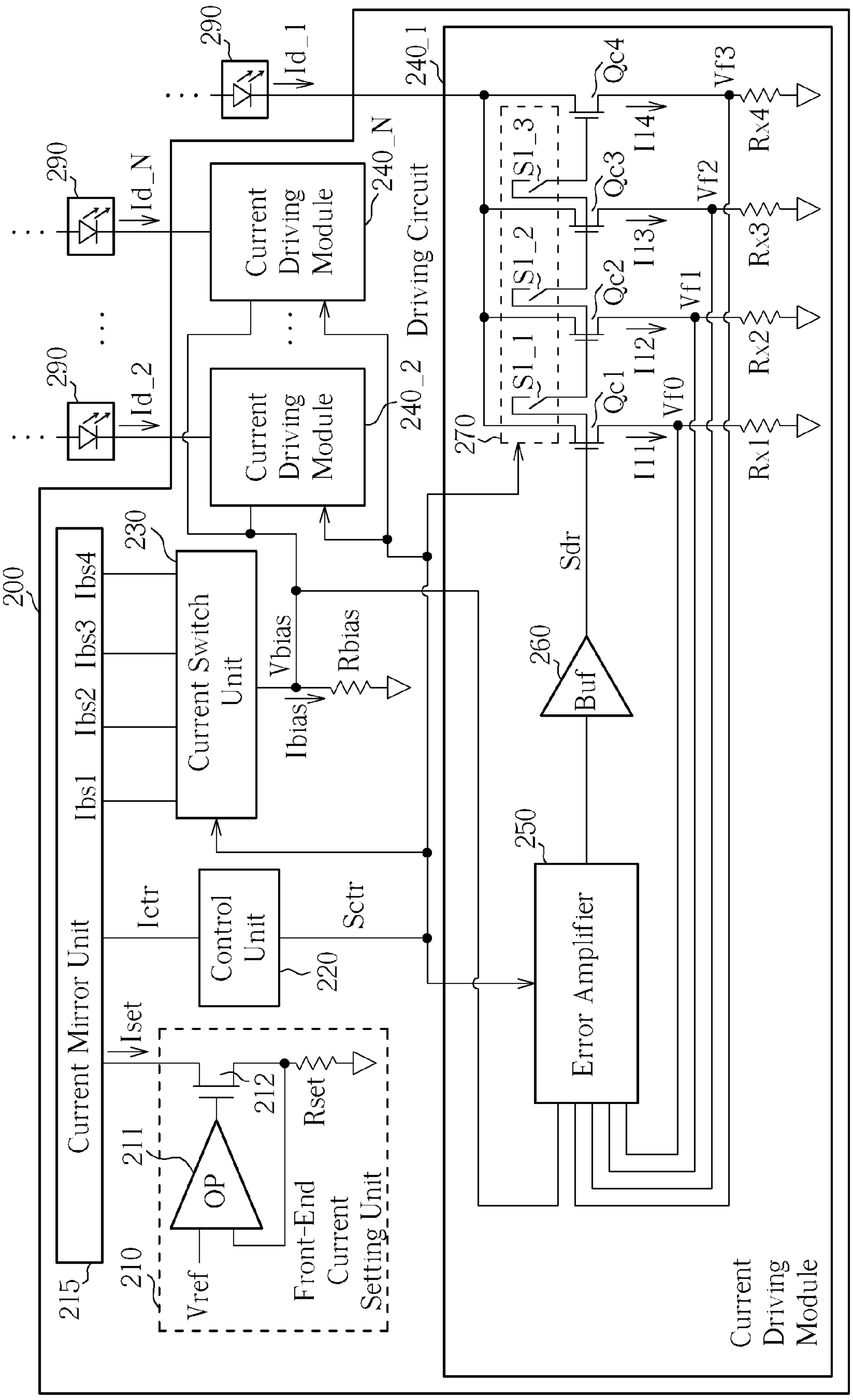
FIG. 2 is a diagram of an embodiment of a driving circuit having current balancing functionality.

FIG. 2 is a diagram of an embodiment of a driving circuit having current balancing functionality. In operation of driving circuit 200, front-end current setting unit 210 is used for generating setting current Iset through operational amplifier 211, transistor 212 controlled by output voltage of operational amplifier 211, and current setting resistor Rset in series with transistor 212 according to reference voltage Vref. Current mirror unit 215 is used for outputting control current Ictr and a plurality of bias setting currents Ibs1-Ibs4 according to setting current Iset. Control unit 220 is used for generating control signal Sctr having at least one bit according to control current Ictr. Control current Ictr may be the same as or different than setting current Iset, and each bias setting current Ibs1-Ibs4 may also be the same as or different than setting current Iset. In the embodiment shown in FIG. 2, control signal Sctr is a 3-bit signal. In different types of application designs, control signal Sctr may have different number of bits according to preset matching accuracy of a plurality of driving currents Id_1-Id_N. Thus, the number of bits required for control signal Sctr will be higher for higher preset matching accuracy.

Current switch unit 230 is used for generating bias current Ibias flowing through bias resistor Rbias according to control signal Sctr and the plurality of bias setting currents Ibs1-Ibs4, and thereby providing bias voltage Vbias fed back to a plurality of current driving modules 240_1-240_N. Please note that bias current Ibias generated by current switch unit 230 is for holding bias voltage Vbias within a predetermined voltage range. The predetermined voltage range preferably corresponds to a relatively high voltage for reducing back-end operational amplifier output voltage error percentage. The plurality of current driving modules 240_1-240_N is used for providing a plurality of driving currents Id_1-Id_N according to bias voltage Vbias and control signal Sctr for driving a plurality of LED units 290. Each current driving module 240_1-240_N has the same internal circuit structure. FIG. 2 only shows internal circuit structure of current driving module 240_1 so as to simplify the figures and description thereof.

Current driving module 240_1 comprises error amplifier 250, buffer 260, current-limit control unit 270 having a plurality of current-limit control switches S1_1-S1_3, a plurality of transistors Qc1-Qc4, and a plurality of current-limit resistors Rx1-Rx4. Error amplifier 250 is used for driving buffer 260 to provide driving signal Sdr according to bias voltage Vbias and a plurality of feedback voltages Vf0-Vf3 fed back through the plurality of current-limit resistors Rx1-Rx4.

First transistor Qc1 in series with first current-limit resistor Rx1 is used for controlling first branch current I11 of driving current Id_1 flowing through first current-limit resistor Rx1 according to driving signal Sdr. Second transistor Qc2 in series with second current-limit resistor Rx2 is electrically connected to first current-limit control switch S1_1. First current-limit control switch S1_1 enables/disables operation of second transistor Qc2 according to first bit of control signal Sctr. When operation of second transistor Qc2 is enabled, second transistor Qc2 is used for controlling second branch current I12 of driving current Id_1 flowing through second current-limit resistor Rx2 according to driving signal Sdr.

Third transistor Qc3 in series with third current-limit resistor Rx3 is electrically connected to second current-limit control switch S1_2. Second current-limit control switch S1_2 enables/disables operation of third transistor Qc3 according to second bit of control signal Sctr. When operation of third transistor Qc3 is enabled, third transistor Qc3 is used for controlling third branch current I13 of driving current Id_1 flowing through third current-limit resistor Rx3 according to driving signal Sdr. Fourth transistor Qc4 in series with fourth current-limit resistor Rx4 is electrically connected to third current-limit control switch S1_3. Third current-limit control switch S1_3 enables/disables operation of fourth transistor Qc4 according to third bit of control signal Sctr. When operation of fourth transistor Qc4 is enabled, fourth transistor Qc4 is used for controlling fourth branch current I14 of driving current Id_1 flowing through fourth current-limit resistor Rx4 according to driving signal Sdr.

It can be seen from the above that current driving module 240_1 performs rough current adjustment according to control signal Sctr to set a current variation region of driving current Id_1, and performs fine current adjustment in the current variation region set according to bias voltage Vbias to provide required driving current Id_1. Thus, bias voltage Vbias need only vary over a predetermined small voltage range corresponding to fine current adjustment, and rough current adjustment is controlled through current-limit control unit 270. For example, when first current-limit control switch S1_1, second current-limit control switch S1_2 and third current-limit control switch S1_3 are all in disconnected state, because driving current Id_1 only flows through first current-limit resistor Rx1, current driving module 240_1 may control driving current Id_1 to be within a lowest current range according to bias voltage Vbias. When first current-limit control switch S1_1 is in closed state, and second current-limit control switch S1_2 and third current-limit control switch S1_3 are in disconnected state, because driving current Id_1 flows through first current-limit resistor Rx1 and second current-limit resistor Rx2 in parallel, current driving module 240_1 may control driving current Id_1 to be within a second-lowest current range according to bias voltage Vbias. When first current-limit control switch S1_1, second current-limit control switch S1_2 and third current-limit control switch S1_3 are all in closed state, because driving current Id_1 flows through first current-limit resistor Rx1 second current-limit resistor Rx2, third current-limit resistor Rx3, and fourth current-limit resistor Rx4, current driving module 240_1 may control driving current Id_1 to be within a highest current range according to bias voltage Vbias. When first current-limit control switch S1_1 and second current-limit control switch S1_2 are in closed state, and third current-limit control switch S1_3 is in disconnected state, because driving current Id_1 flows through first current-limit resistor Rx1, second current-limit resistor Rx2 and third current-limit resistor Rx3 in parallel, current driving module 240_1 may control driving current Id_1 to be within a second-lowest current range according to bias voltage Vbias. Thus, in operation of driving circuit 200, although bias voltage Vbias only varies over a predetermined small voltage range, the plurality of current driving modules 240_1-240_N may perform accurate large-range current control of the plurality of driving currents Id_1-Id_N to drive the plurality of LED units 290 to generate output light that is uniform and capable of accurate brightness adjustment over a large range.

Figure 3:
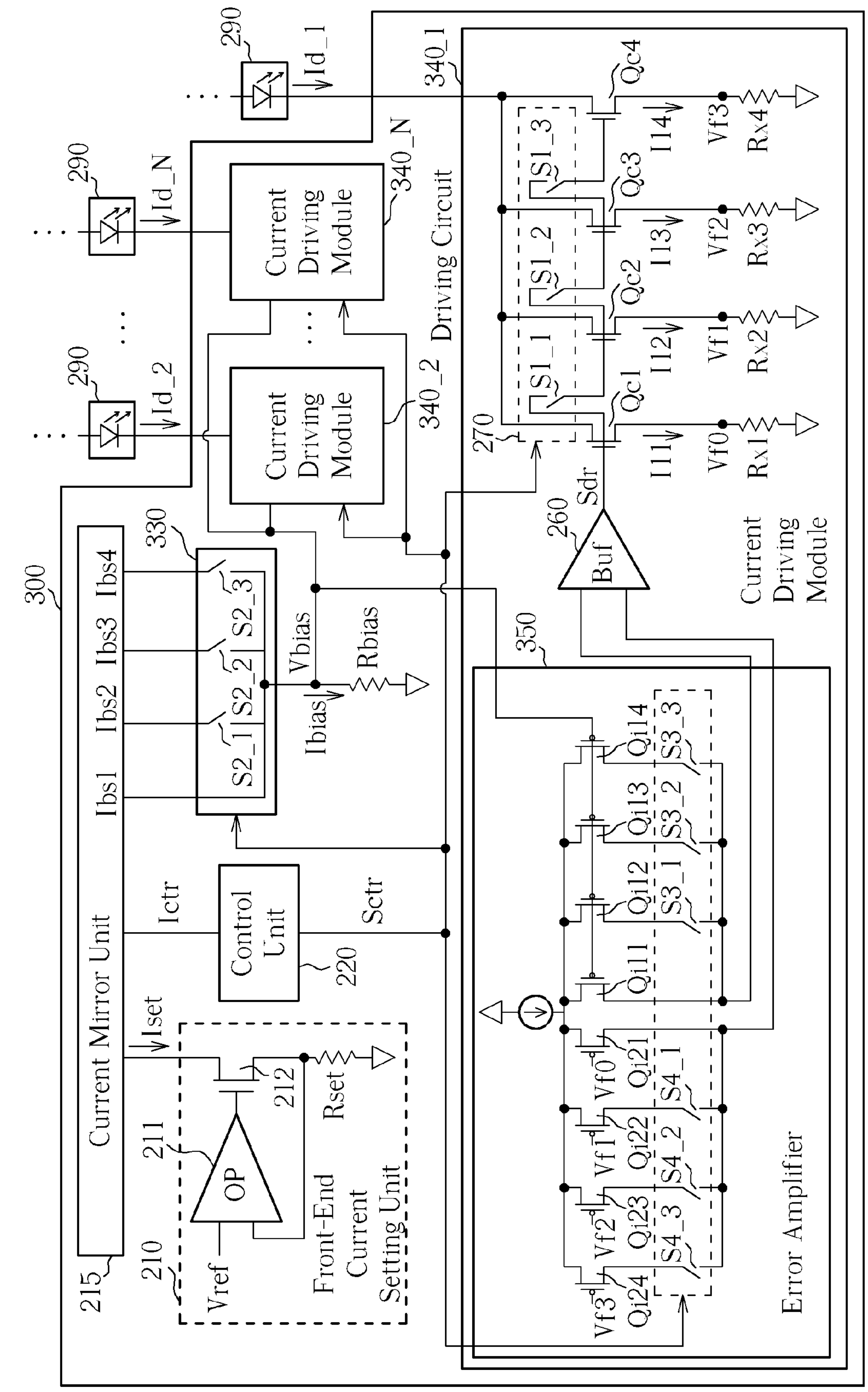
FIG. 3 is a diagram of another embodiment of a driving circuit having current balancing functionality.

FIG. 3 is a diagram of another embodiment of a driving circuit having current balancing functionality. As shown in FIG. 3, driving circuit 300 is similar to driving circuit 200 of FIG. 2, differing primarily in replacing current switch unit 230 with current switch unit 330 comprising a plurality of current switches S2_1-S2_3, and replacing current driving modules 240_1-240_N with a plurality of current driving modules 340_1-340_N. First current switch S2_1 is controlled by first bit of control signal Sctr, second current switch S2_2 is controlled by second bit of control signal Sctr, and third current switch S2_3 is controlled by third bit of control signal Sctr.

When current driving module 340_1 controls driving current Id_1 to be in a lowest current range according to bias voltage Vbias, first current-limit control switch S1_1, second current-limit control switch S1_2, and third current-limit control switch S1_3 are controlled to be in disconnected state according to control signal Sctr. Simultaneously, first current switch S2_1, second current switch S2_2 and third current switch S2_3 are controlled to be in closed state according to control signal Sctr. Thus, bias current Ibias is combined current of bias setting currents Ibs1-Ibs4, so as to keep bias voltage Vbias within a predetermined voltage range. Although driving current Id_1 is in the lowest current range, through operation of current switch unit 330, the predetermined voltage range can more optimally correspond to relatively high voltage, thereby lowering back-end operational amplifier output voltage error percentage.

When current driving module 340_1 controls driving current Id_1 to be in a second-lowest current range according to bias voltage Vbias, first current switch S2_1, second current-limit control switch S1_2 and third current-limit control switch S1_3 according to control signal Sctr are controlled to be in disconnected state. Simultaneously, first current-limit control switch S1_1, second current switch S2_2 and third current switch S2_3 are controlled to be in closed state according to control signal Sctr. Thus, bias current Ibias is combined current of bias setting currents Ibs1, Ibs3, Ibs4, so as to keep bias voltage Vbias in the predetermined voltage range. Likewise, through operation of current switch unit 330, the predetermined voltage range can more optimally correspond to a relatively high voltage to reduce back-end operational amplifier output voltage error percentage.

When current driving module 340_1 controls driving current Id_1 to be in a second-highest current range according to bias voltage Vbias, first current switch S2_1, second current switch S2_2 and third current-limit control switch S1_3 are controlled to be in disconnected state according to control signal Sctr. Simultaneously, first current-limit control switch S1_1, second current-limit control switch S1_2 and third current switch S2_3 are controlled to be in closed state according to control signal Sctr. Thus, bias current Ibias is combined current of bias setting currents Ibs1, Ibs4, so as to keep bias voltage Vbias within a predetermined voltage range. Likewise, the predetermined voltage range can more optimally correspond to relatively high voltage to reduce back-end operational amplifier output voltage error percentage.

When current driving module 340_1 controls driving current Id_1 to be in a highest current range according to bias voltage Vbias, first current switch S2_1, second current switch S2_2 and third current switch S2_3 are controlled to be in disconnected state according to control signal Sctr. Likewise, first current-limit control switch S1_1, second current-limit control switch S1_2 and third current-limit control switch S1_3 are controlled to be inclosed state according to control signal Sctr. Thus, bias current Ibias is bias setting current Ibs1, so as to keep bias voltage Vbias within a predetermined voltage range. Likewise, the predetermined voltage range can more optimally correspond to relatively high voltage to reduce back-end operational amplifier output voltage error percentage.

Current driving module 340_1 shown by FIG. 3 is similar to current driving module 240_1 of FIG. 2, differing primarily in using error amplifier 350 instead of error amplifier 250. Error amplifier 350 comprises a plurality of first input transistors Qi11-Qi14, a plurality of first input control switches S3_1-S3_3, a plurality of second input transistors Qi21-Qi24, and a plurality of second input control switches S4_1-S4_3. First input transistor Qi11 is used for driving buffer 260 according to bias voltage Vbias. Second input transistor Qi21 is used for driving buffer 260 according to feedback voltage Vf0 of first current-limit resistor Rx1.

First input control switch S3_1 in series with first input transistor Qi12 is used for enabling/disabling driving operation of first input transistor Qi12 on buffer 260 according to bias voltage Vbias according to first bit of control signal Sctr. First input control switch S3_2 in series with first input transistor Qi13 is used for enabling/disabling driving operation of first input transistor Qi13 on buffer 260 according to bias voltage Vbias according to second bit of control signal Sctr. First input control switch S3_3 in series with first input transistor Qi14 is used for enabling/disabling driving operation of first input transistor Qi14 on buffer 260 according to bias voltage Vbias according to third bit of control signal Sctr.

Second input control switch S4_1 in series with second input transistor Qi22 is used for enabling/disabling driving operation of second input transistor Qi22 on buffer 260 according to feedback voltage Vf1 of second current-limit resistor Rx2 according to first bit of control signal Sctr. Second input control switch S4_2 in series with second input transistor Qi23 is used for enabling/disabling driving operation of second input transistor Qi23 on buffer 260 according to feedback voltage Vf2 of third current-limit resistor Rx3 according to second bit of control signal Sctr. Second input control switch S4_3 in series with second input transistor Qi24 is used for enabling/disabling driving operation of second input transistor Qi24 on buffer 260 according to feedback voltage Vf3 of fourth current-limit resistor Rx4 according to third bit of control signal Sctr.

In operation of driving circuit 300, when current driving module 340_1 controls driving current Id_1 to be in a lowest current range according to bias voltage Vbias, first input control switches S3_1-S3_3 and second input control switches S4_1-S4_3 are all controlled to be in disconnected state according to control signal Sctr. When current driving module 340_1 controls driving current Id_1 to be in a second-lowest current range according to bias voltage Vbias, first input control switch S3_1 and second input control switch S4_1 are controlled to be in closed state according to control signal Sctr. Simultaneously, first input control switches S3_2-S3_3 and second input control switches S4_2-S4_3 are controlled to be in disconnected state according to control signal Sctr. When current driving module 340_1 controls driving current Id_1 to be in a second-highest current range according to bias voltage Vbias, first input control switches S3_1-S3_2 and second input control switches S4_1-S4_2 are controlled to be inclosed state according to control signal Sctr. Simultaneously, first input control switch S3_3 and second input control switch S4_3 are controlled to be in disconnected state according to control signal Sctr. When current driving module 340_1 controls driving current Id_1 to be in a highest current range according to bias voltage Vbias, first input control switches S3_1-S3_3 and second input control switches S4_1-S4_3 are all controlled to be in closed state according to control signal Sctr.

First input control switch S3_1 and second input control switch S4_1 are closed or disconnected in sync with first current-limit control switch 511. First input control switch S3_2 and second input control switch S4_2 are closed or opened in sync with second current-limit control switch S1_2. First input control switch S3_3 and second input control switch S4_3 are closed or opened in sync with third current-limit control switch S1_3. It can be seen from the above that internal circuit operation of error amplifier 350 can perform accurate error amplification processing on bias voltage Vbias and feedback voltages Vf0-Vf3, thereby driving buffer 260 to provide accurate driving signal Sdr, providing accurate fine current adjustment control of driving current Id_1 in all current ranges.

In summary of the above, driving circuits use a control signal to perform rough current adjustment to set current variation range of driving current, and use driving signal to perform fine current adjustment control within the current variation range set to provide required driving current. Thus, in operation of error amplifier used for generating accurate driving signal, input bias voltage of error amplifier can be set to vary within a small voltage range of a relatively high voltage, thereby reducing operational amplifier output voltage error percentage, so as to generate driving signal accurately, and thereby provide accurate control of a large range of currents to drive LED units to generate output light that is uniform and can be adjusted accurately over a large range of brightness.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A driving circuit having current balancing functionality, comprising:

a control unit for generating a control signal having at least one bit according to a control current;

a bias resistor for providing a bias voltage according to a bias current;

a current switch unit for generating the bias current according to the control signal and a plurality of bias setting currents to keep the bias voltage within a preset voltage range; and a plurality of current driving modules for providing a plurality of driving currents according to the bias voltage and the control signal, each current driving module comprising a current-limit control unit, the current-limit control unit for controlling a corresponding driving current according to the control signal.

2. The driving circuit of claim 1, wherein each current driving module further comprises:

a plurality of current-limit resistors;

a first transistor coupled in series with a first current-limit resistor of the plurality of current-limit resistors for controlling a first branch current of the driving current flowing through the first current-limit resistor according to a driving signal; and a second transistor electrically connected to the current-limit control unit, the second transistor coupled in series with a second current-limit resistor of the plurality of current-limit resistors;

wherein the current-limit control unit enables/disables operation of the second transistor according to the control signal, and the second transistor is used for controlling a second branch current of the driving current flowing through the second current-limit resistor according to the driving signal when operation of the second transistor is enabled.

3. The driving circuit of claim 2, wherein each current driving module further comprises:

a third transistor electrically connected to the current-limit control unit, the third transistor coupled in series with a third current-limit resistor of the plurality of current-limit resistors;

wherein the current-limit control unit enables/disables operation of the third transistor according to the control signal, and the third transistor is used for controlling a third branch current of the driving current flowing through a third current-limit resistor according to the driving signal when operation of the third transistor is enabled.

4. The driving circuit of claim 2, wherein each current driving module further comprises:

an error amplifier for driving a buffer to provide the driving signal according to the bias voltage and a plurality feedback voltages fed back through the first current-limit resistor and the second current-limit resistor.

5. The driving circuit of claim 4, wherein the error amplifier comprises:

a first input transistor in series with a first input control switch, the first input control switch enabling/disabling driving operation of the first input transistor on the buffer according to the bias voltage according to the control signal; and a second input transistor in series with a second input control switch, the second input control switch enabling/disabling driving operation of the second input transistor on the buffer according to the corresponding feedback voltage according to the control signal.

6. The driving circuit of claim 4, wherein the error amplifier comprises:

a first input transistor for driving the buffer according to the bias voltage; and a second input transistor for driving the buffer according to the corresponding feedback voltage.

7. The driving circuit of claim 1, further comprising:

a current mirror unit for outputting the control current and the plurality of bias setting currents according to a preset current; and a front-end current setting unit for providing the preset current according to a reference voltage.

8. The driving circuit of claim 7, wherein the front-end current setting unit comprises an operational amplifier, a transistor controlled by an output voltage of the operational amplifier, and a current setting resistor in series with the transistor.

9. The driving circuit of claim 7, wherein the current mirror unit provides the control current essentially equal to the preset current.

10. The driving circuit of claim 7, wherein the current mirror unit provides each bias setting current essentially equal to the preset current.

11. The driving circuit of claim 1, wherein bit number of the control signal is determined according to a preset matching accuracy of the driving currents.

12. The driving circuit of claim 1, wherein:

the current switch unit has a first current switch controlled by a first bit of the control signal; and the current-limit control unit has a first current-limit control switch controlled by the first bit of the control signal.

13. The driving circuit of claim 12, wherein the first current-limit control switch operates in disconnected state when the first current switch operates in closed state, and the first current-limit control switch operates in closed state when the first current switch operates in disconnected state.

14. The driving circuit of claim 12, wherein:

the current switch unit has a second current switch controlled by a second bit of the control signal; and the current-limit control unit has a second current-limit control switch controlled by the second bit of the control signal.

15. The driving circuit of claim 14, wherein the first current-limit control switch and the second current-limit control switch operate in disconnected state when the first current switch and the second current switch operate in closed state, and the first current-limit control switch and the second current-limit control switch operate in closed state when the first current switch and the second current switch operate in disconnected state.

* * * * *